United States Patent
Chait et al.

(10) Patent No.: US 8,922,196 B2
(45) Date of Patent: Dec. 30, 2014

(54) MULTIFUNCTION TEST INSTRUMENT PROBE

(71) Applicants: Paul Nicholas Chait, San Rafael, CA (US); Stanley Chait, New York, NY (US)

(72) Inventors: Paul Nicholas Chait, San Rafael, CA (US); Stanley Chait, New York, NY (US)

(*) Notice: Subject to any disclaimer, the term of this patent is extended or adjusted under 35 U.S.C. 154(b) by 174 days.

(21) Appl. No.: 13/838,547

(22) Filed: Mar. 15, 2013

(65) Prior Publication Data

US 2013/0249533 A1    Sep. 26, 2013

Related U.S. Application Data

(60) Provisional application No. 61/613,169, filed on Mar. 20, 2012.

(51) Int. Cl.
  *G01R 1/06*    (2006.01)
  *G01R 1/067*   (2006.01)
  *G01R 1/073*   (2006.01)

(52) U.S. Cl.
  CPC ........ *G01R 1/06788* (2013.01); *G01R 1/07307* (2013.01)
  USPC .................. 324/149; 324/754.01; 324/754.02; 324/754.03; 324/754.14; 324/755.01; 324/755.05; 324/72.5

(58) Field of Classification Search
  CPC ........... G01R 1/06788; G01R 1/06711; G01R 1/06722; G01R 19/14; G01R 19/155; G01R 1/07307; G01R 31/026; H01R 11/24; H01R 4/308; H01R 11/18; H01R 11/22
  USPC .......... 324/72.5, 149, 754.02, 754.03, 754.11, 324/754.12–754.14, 754.05, 754.01–754.3, 324/755.01–755.11, 762.01–762.1
  See application file for complete search history.

(56) References Cited

U.S. PATENT DOCUMENTS

| | | | |
|---|---|---|---|
| 2,522,810 A | | 9/1950 | Bailey |
| 2,549,731 A | * | 4/1951 | Wattley .................. 439/482 |
| 2,918,646 A | | 12/1959 | Davidson |
| 3,182,257 A | * | 5/1965 | Linkowski .................. 324/149 |
| 4,151,462 A | | 4/1979 | Teyler |
| 7,902,848 B2 | | 3/2011 | Eccleston |

* cited by examiner

*Primary Examiner* — Arleen M Vazquez
*Assistant Examiner* — Lee Rodak
(74) *Attorney, Agent, or Firm* — Larry D. Johnson

(57) ABSTRACT

A multifunction test instrument probe includes a housing having a hollow bore with an open end. A clamp plunger is carried in the hollow bore, with a first end including a thumb press, and a second end including an alligator clamp having a pair of jaws, with a compression spring normally biasing the thumb press away from the housing, and normally biasing the alligator clamp substantially within the hollow bore proximate the open end. A point plunger is also carried in the bore, with a first end including a thumb press, and a second end terminating in a point, with a second compression spring normally biasing the thumb press away from the housing, and biasing the point within the hollow bore proximate the open end. When the clamp plunger is depressed, the alligator clamp is extended from the open end and the jaws are urged open by a jaw spring, and when the clamp plunger is released, the compression spring acts to retract the alligator clamp back towards the hollow bore and the jaws are urged closed by contact with the open end. When the point plunger is depressed, the point is extended from the open end. When the clamp plunger is again depressed, the point retracts into the housing.

17 Claims, 10 Drawing Sheets

MULTIFUNCTION TEST INSTRUMENT PROBE

CROSS REFERENCE TO RELATED APPLICATIONS

The present application claims the benefit of the filing date of U.S. Provisional Patent Application Ser. No. 61/613,169, filed Mar. 20, 2012. The foregoing application is incorporated by reference in its entirety as if fully set forth herein.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates generally to electrical test instrument probes, and more particularly, to probes which incorporate two different types of tips within one probe.

BACKGROUND INFORMATION AND DISCUSSION OF RELATED ART

Test instruments such as AC Voltmeters, DC Voltmeters, Ammeters and Ohmeters are all used for measuring the numerical value of their respective functions. All of these measurements and many more are available within one instrument known as a Multimeter or VOM (Volt-Ohmeter). The multimeter can be manually switched between the various functions, usually with a rotary selector knob or pushbutton switch and displays the numeric value of the function with an analog or digital read-out, and is used in all major sectors of machinery and electronics testing encompassing transportation, communications, computer, control, instrumentation, and components in various electrical circuits and devices. A multimeter also has two receptacles, one labeled (+) and the other labeled (−) into which are plugged two test leads, each lead connecting onto a hand-held probe, to be described below, which is the means of making electrical contact to specific locations on the Device Under Test (DUT). These probes are designed for convenience and safety to insulate and separate the user's fingers away from any electrical contact from the DUT and the multimeter. The probes are in the form of two insulating plastic stems, one held in each hand, each typically about 5-6 inches long and ½ to ¾ of an inch in diameter terminated with either a point-type or clamp-type tip and with a receptacle on each stem to accommodate the plug of a test-wire lead. The two test leads are each a very flexible insulated wire typically about 5 feet long. Most often one lead as well as one probe is colored red to denote positive, and the other lead and probe colored black to denote negative or ground, although other colors may be used. There is a plug on each end of the test lead, one plug plugging-into the receptacle on the stem, the other plug plugging-into a corresponding receptacle on the multimeter.

At the contact end of the probe stem that interfaces with the circuitry of the DUT, different probe tips are required for different test applications. For instance, it is sometimes convenient to have one of the probes tipped (terminated) with an 'alligator-clamp', sometimes called 'clip', used to clamp the probe to a wire, terminal, or chassis on the DUT (such as a negative, common, or ground) while the second probe tip is a pointed metal rod, called a point or 'pin', used to make point contact with locations on the DUT such as the pin-outs of IC chips and on component leads and connections, which require a pointed tip. The alligator clamp of one probe (usually the (−) for DC and 'ground' for AC tests) is often clamped in place and that hand can then be removed. Other tests may require both probe tips to be points, or both to be clamps. To meet changing requirements of the test, it is often necessary to change-out one or both of the probes by un-plugging one probe and plugging-in another probe (or probe tips if these are replaceable). The changing to a different tip from that already on the probe, which in practice is often unavailable due to being lost or misplaced, requires two hands, consumes time, and can result in accidents. For example, to avoid the inconvenience of retrieving and installing the appropriate probe or tip, the operator may continue to work with the existing configuration, risking equipment damage or even personal injury.

Consequently, there is a need for electrical test probes where different connector tips (e.g., clamps or points) can be easily deployed with a minimum of experience or practice, without physically replacing the probe or installing a different tip, and using only a thumb movement of the same hand holding the probe without having to subvert the continuity of the test procedure by diverting the eyes away from the DUT to do this.

Some prior patents provide background to the present invention. For example, U.S. Pat. No. 2,522,810 to Bailey discloses an insulated electrical connector comprising a pair of insulated, spring loaded pivoted jaws.

U.S. Pat. No. 2,918,646 describes a convertible test probe adapted for effecting electrical test contact either by clipping, probing, or sliding contact.

U.S. Pat. No. 4,151,462 to Teyler teaches an electrical test probe having a spring biased clip with an extendable and retractable tip movable within the clip. The normally retracted tip is extendible intermediate spring biased jaws of the electrical probe and is retained in the extended position by a spring bias and the gripping action of the jaws. The housing for the probe includes a compartment for containing interchangeable active or passive circuitry operative upon the signal sensed by the probe or a signal injected thereto from the probe. Apparatus for checking the electrical continuity through the probe is also disposed within the housing. A socket which provides both electrical and structural interconnection between the probe and an attached electrical conductor(s) is disposed at the rear of the housing.

U.S. Pat. No. 7,902,848 to Eccleston, et al. discloses a reversible test probe and test probe tip. In one embodiment, a test probe tip is reversible relative to a test probe body. The reversible probe has a first probe tip at a first end and a second probe tip at a second end. The test probe body has an opening operable to receive the first probe tip and the second probe tip. When the first probe tip is positioned in the opening, the first probe tip is electrically coupled to a metal device in the test probe body. When the second probe tip is positioned in the opening, the second probe tip is electrically coupled to a metal device in the test probe body. In another embodiment, a test probe having two test probe tips is reversible relative to a test lead.

The foregoing patents reflect the current state of the art of which the present inventor is aware. Reference to, and discussion of, these patents is intended to aid in discharging Applicant's acknowledged duty of candor in disclosing information that may be relevant to the examination of claims to the present invention. However, it is respectfully submitted that none of the above-indicated patents disclose, teach, suggest, show, or otherwise render obvious, either singly or when considered in combination, the invention described and claimed herein.

SUMMARY OF THE INVENTION

The present invention provides an improved multifunction test instrument probe with a plurality of integral tips, with each type of tip being independently selectable by means of a thumb movement of the hand holding the probe. The apparatus includes a housing having a hollow bore with an open end. An alligator clamp plunger is carried in the hollow bore, with a first end including a thumb press, and a second end including an alligator clamp having a pair of jaws, with a compression spring normally biasing the thumb press away from the housing, and normally biasing the alligator clamp substantially within the hollow bore proximate the open end. A point plunger is also carried in the bore, with a first end including a thumb press, and a second end terminating in a point, with a second compression spring normally biasing the thumb press away from the housing, and biasing the point within the hollow bore proximate the open end. When the clamp plunger is depressed, the alligator clamp is extended from the open end and the jaws are urged open by a jaw spring, and when the clamp plunger is released, the compression spring acts to retract the alligator clamp back towards the hollow bore and the jaws are urged closed by contact with the open end. When the point plunger is depressed, the point is extended from the open end.

It is therefore an object of the present invention to provide a new and improved multifunction test instrument probe.

It is another object of the present invention to provide a new and improved test instrument probe that can perform electrical testing with a minimum of distractions caused by changing probes.

A further object or feature of the present invention is a new and improved multifunction test instrument probe that can selectively extend and retract a variety of tips by means of a thumb movement of the hand holding the probe.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter of the claims appended hereto. Those skilled in the art will appreciate that the conception upon which this disclosure is based readily may be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the invention of this application, which is measured by the claims, nor is it intended to be limiting as to the scope of the invention in any way.

Certain terminology and derivations thereof may be used in the following description for convenience in reference only, and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

BRIEF DESCRIPTION OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 1A:
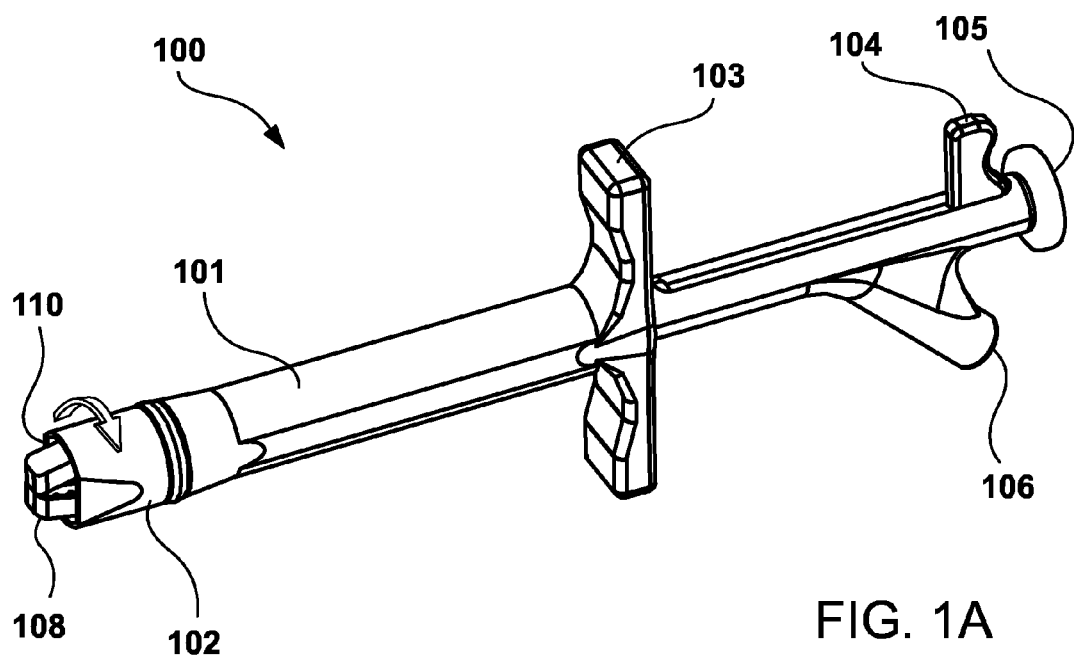
FIG. 1A is a front perspective view of a multifunction test instrument probe of this invention at rest, with both the alligator clamp and point portions of the probe retracted within the housing.

Referring to FIGS. 1 through 10, wherein like reference numerals refer to like components in the various views, there is illustrated therein a new and improved multifunction test instrument probe, generally denominated 100 herein.

FIG. 1A is a front perspective view of a first preferred embodiment of the probe 100 at rest, comprising probe housing 101, manually rotatable end 102, finger grip 103, point thumb press 104, clamp thumb press 105, and test lead socket 106. In this view of the probe at rest, both the alligator clamp and point portions of the probe are retracted within the housing, with only the distal end of the alligator clamp 108 visible through open end 110 of the housing. The housing 101 may be of any appropriate shape, including cylindrical, square, rectangular, or multifaceted.

Figure 1B:
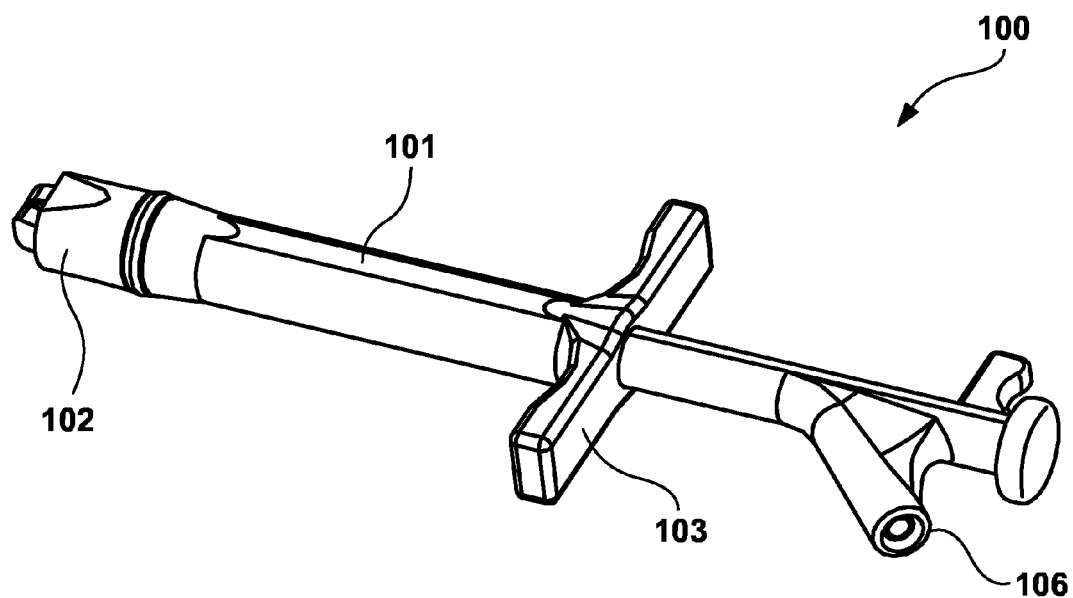
FIG. 1B is a lower perspective view of the probe illustrating the test lead socket.

FIG. 1B is a lower perspective view of the probe 100 illustrating the test lead socket 106, which provides a receptacle for a test wire lead plug.

Figure 2A:
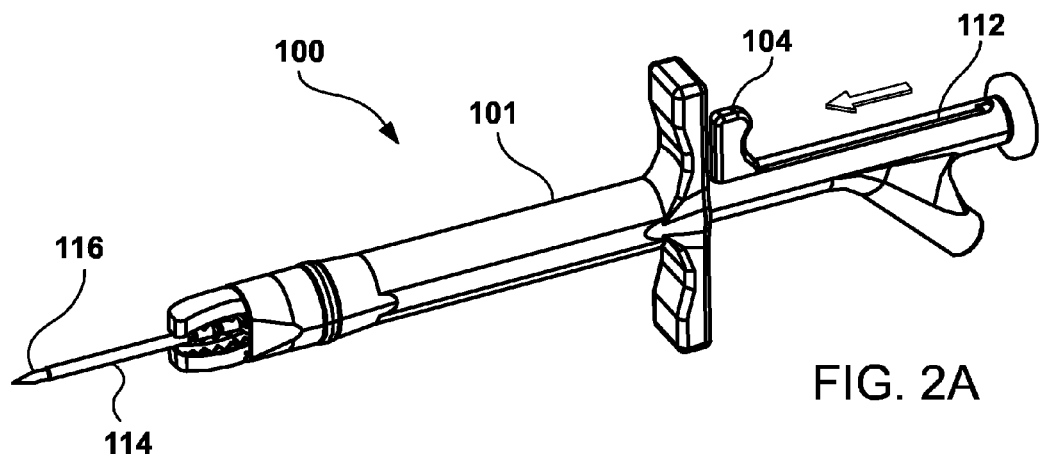
FIG. 2A is a front perspective view of the probe with the point portion extended from the housing.

FIG. 2A is a front perspective view of the probe 100 with the point thumb press 104 having been depressed along slot 112, to extend the point 114 from the housing 101. Point 114 is preferably insulated along its length, except for a bare metal tip 116 to enable electrical contact with the device under test.

Figure 2B:
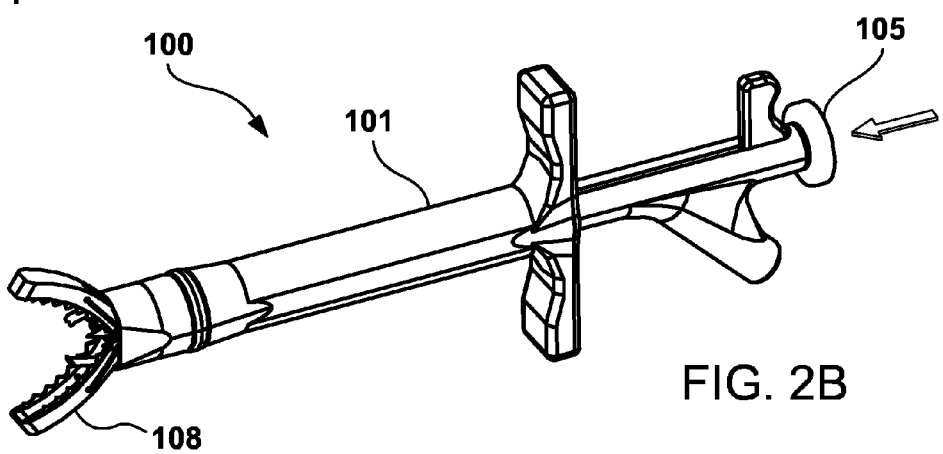
FIG. 2B is a front perspective view of the probe with the alligator clamp portion extended from the housing.
Figure 10:
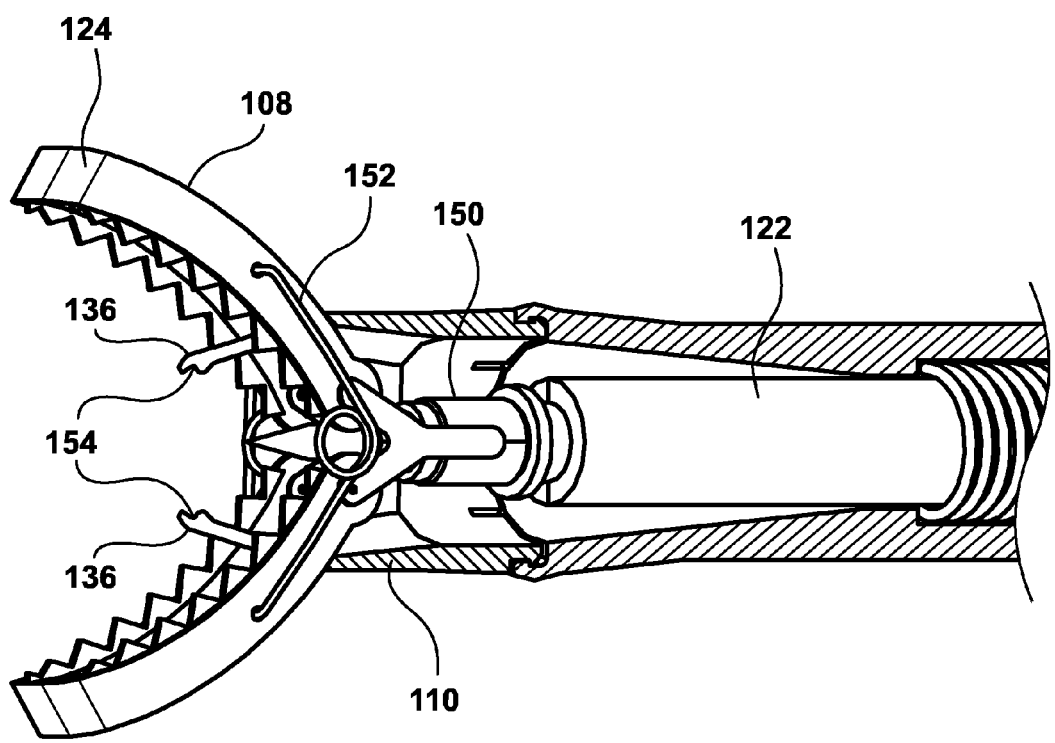
FIG. 10 is a partial cross-section of the open end portion of the probe with the alligator clamp fully open, illustrating the alligator clamp swivel connection that enables selective radial orientation of the jaws.

FIG. 2B is a front perspective view of the probe 100 with the clamp thumb press 105 having been depressed into the housing 101, to retract the point back into the housing (as described below) and extend alligator clamp 108 from the housing. Note: the alligator clamp jaw opening spring (torsion spring) has been omitted from this and subsequent views for clarity, but is illustrated in FIG. 10 below.

Figure 2C:
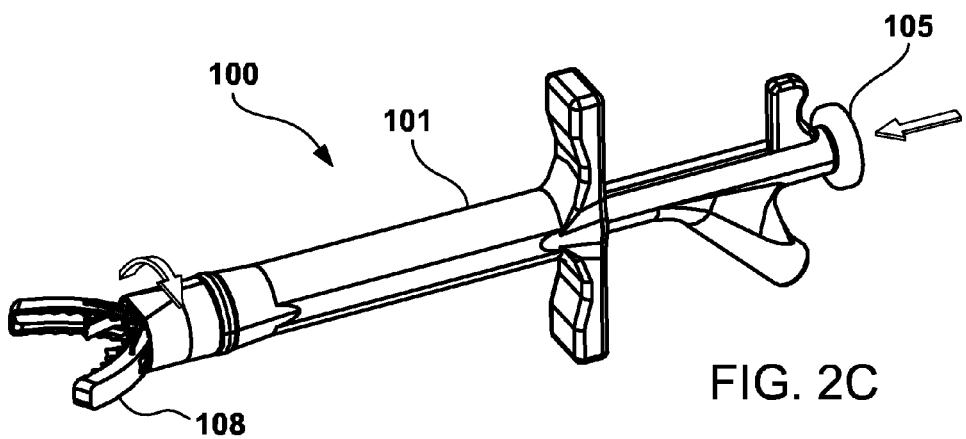
FIG. 2C is a front perspective view of the probe with the alligator clamp portion extended from the housing and swiveled to another orientation.

FIG. 2C is a front perspective view of the probe 100 with the alligator clamp 108 extended from the housing 101 and swiveled to another orientation. This illustrates the ability to manually adjust the alligator clamp to a desired orientation prior to or during use of the probe, and allows the jaws of the clamp to be located in any rotational position relative to the probe so as to be able to view the opening of the jaws and facilitate operational testing. This also avoids an awkward holding of the probe by the user in order to view the jaws correctly.

Figure 3A:
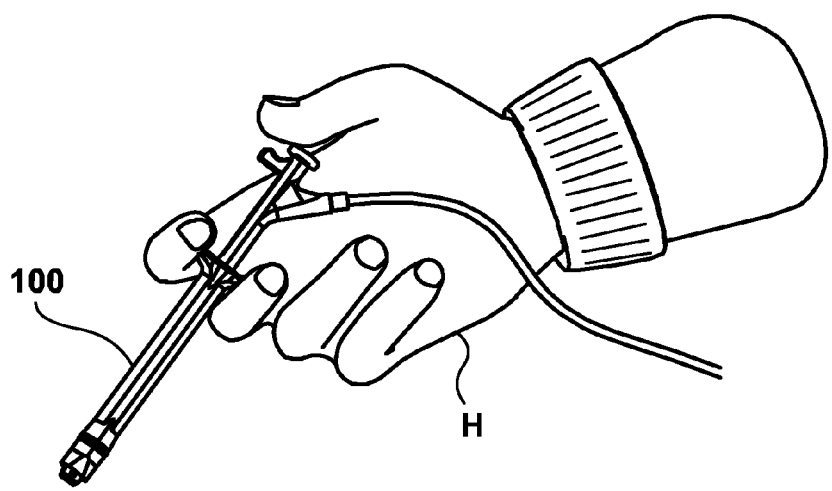
FIG. 3A is a front view of the probe at rest in a user's hand, with both the alligator clamp and point portions retracted within the housing.
Figure 3B:
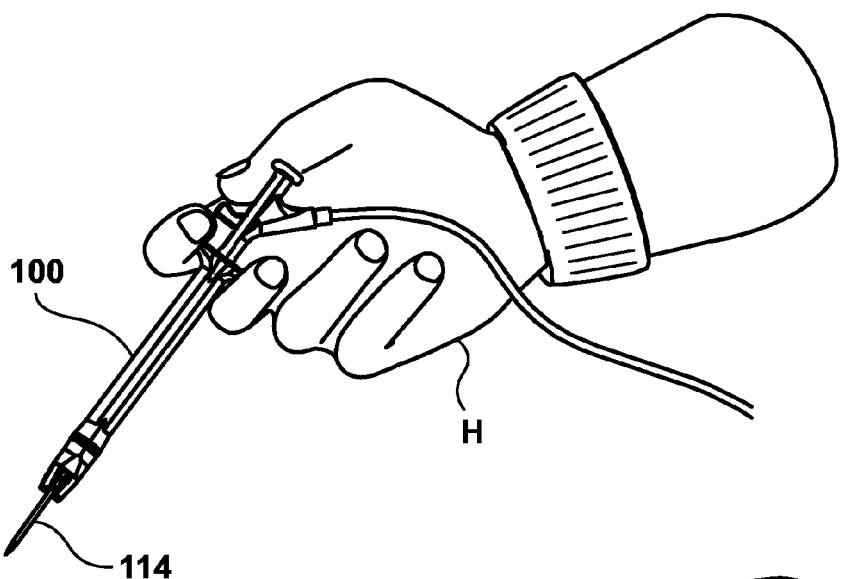
FIG. 3B is a front view of the probe in use in a user's hand, with the point portion extended from the housing.
Figure 3C:
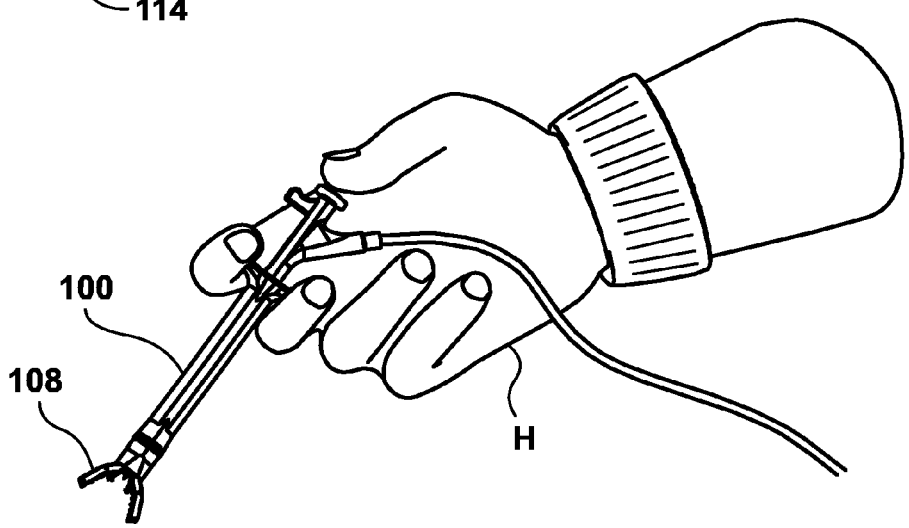
FIG. 3C is a front view of the probe in use in a user's hand, with the alligator clamp portion extended from the housing.

FIG. 3A is a front view of the probe 100 at rest in a user's hand H, with both the alligator clamp and point portions retracted within the housing (as in FIG. 1A). FIG. 3B is a front view of the probe 100 in use in a user's hand H, with the point 114 extended from the housing (as in FIG. 2A). FIG. 3C is a front view of the probe 100 in use in a user's hand H, with the alligator clamp 108 extended from the housing (as in FIG. 2B). These views illustrate that the point thumb press and clamp thumb press are located in relative positions so that single hand operational testing can be achieved with only the need to use thumb movements to deploy and retract the alligator clamp or point.

Figure 4:
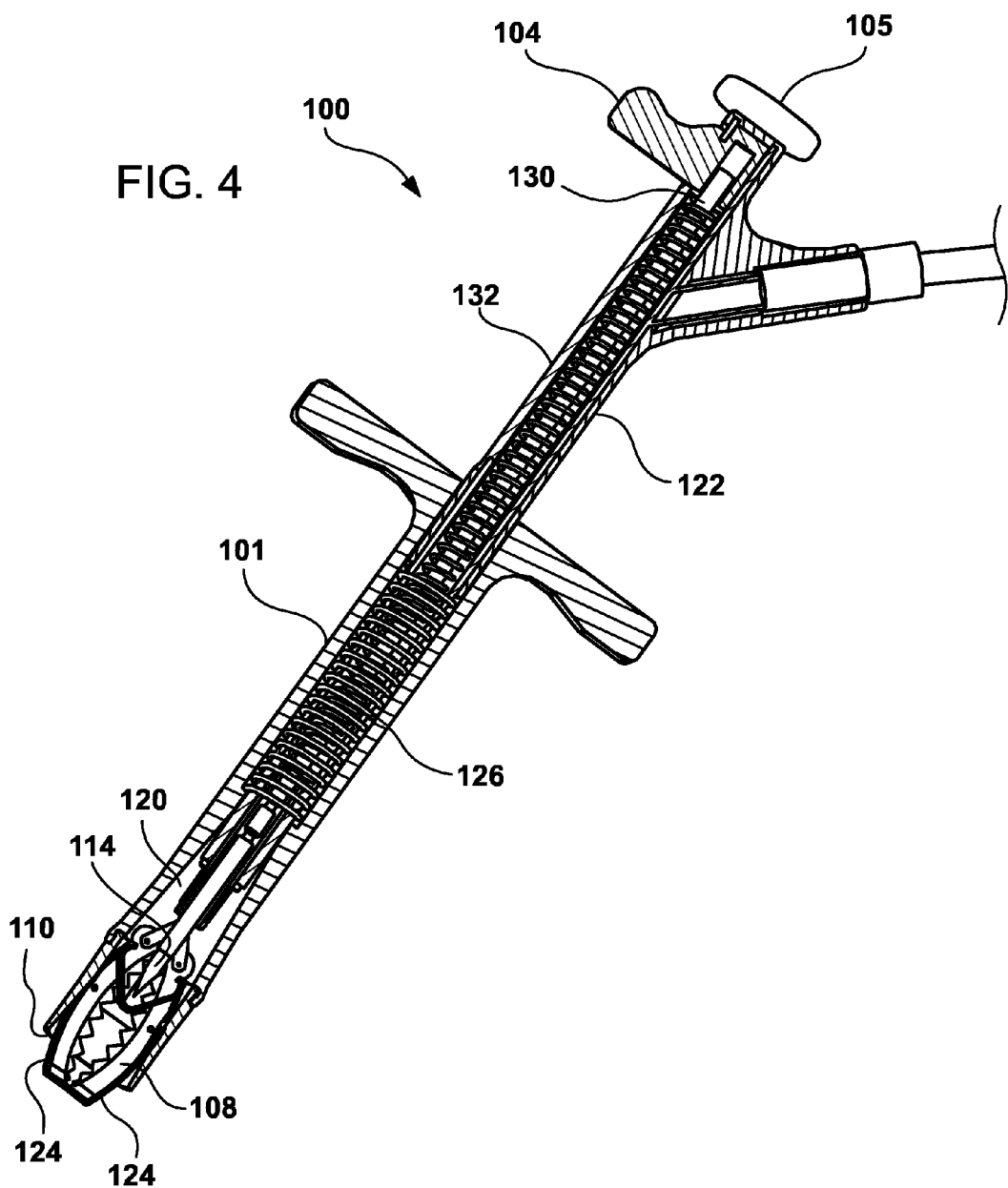
FIG. 4 is a partial cross-section of the probe at rest.

FIG. 4 is a partial cross-section of the probe 100 at rest, illustrating housing 101 having a hollow bore 120 and open end 110. Alligator clamp plunger 122 is carried in the hollow bore 120 and includes thumb press 105 at a first end and alligator clamp 108 having a pair of jaws 124 at a second end. Alligator clamp plunger compression spring 126 normally biases the alligator clamp thumb press 105 away from the housing, and normally biases the alligator clamp 108 substantially within the hollow bore 120 proximate open end 110. Point plunger 130 is also carried in the hollow bore 120 and is preferably coaxial with and inside of alligator clamp plunger 122, and includes point thumb press 104 at a first end and point 114 at a second end. Point plunger compression spring 132 normally biases the point thumb press 104 away from the housing, and biases the point 114 within the hollow bore 120 proximate the open end 110. The housing, plungers, springs, alligator clamp, point, and associated components of the probe are all insulated so that there is no exposed metal when the device is at rest.

Figure 5:
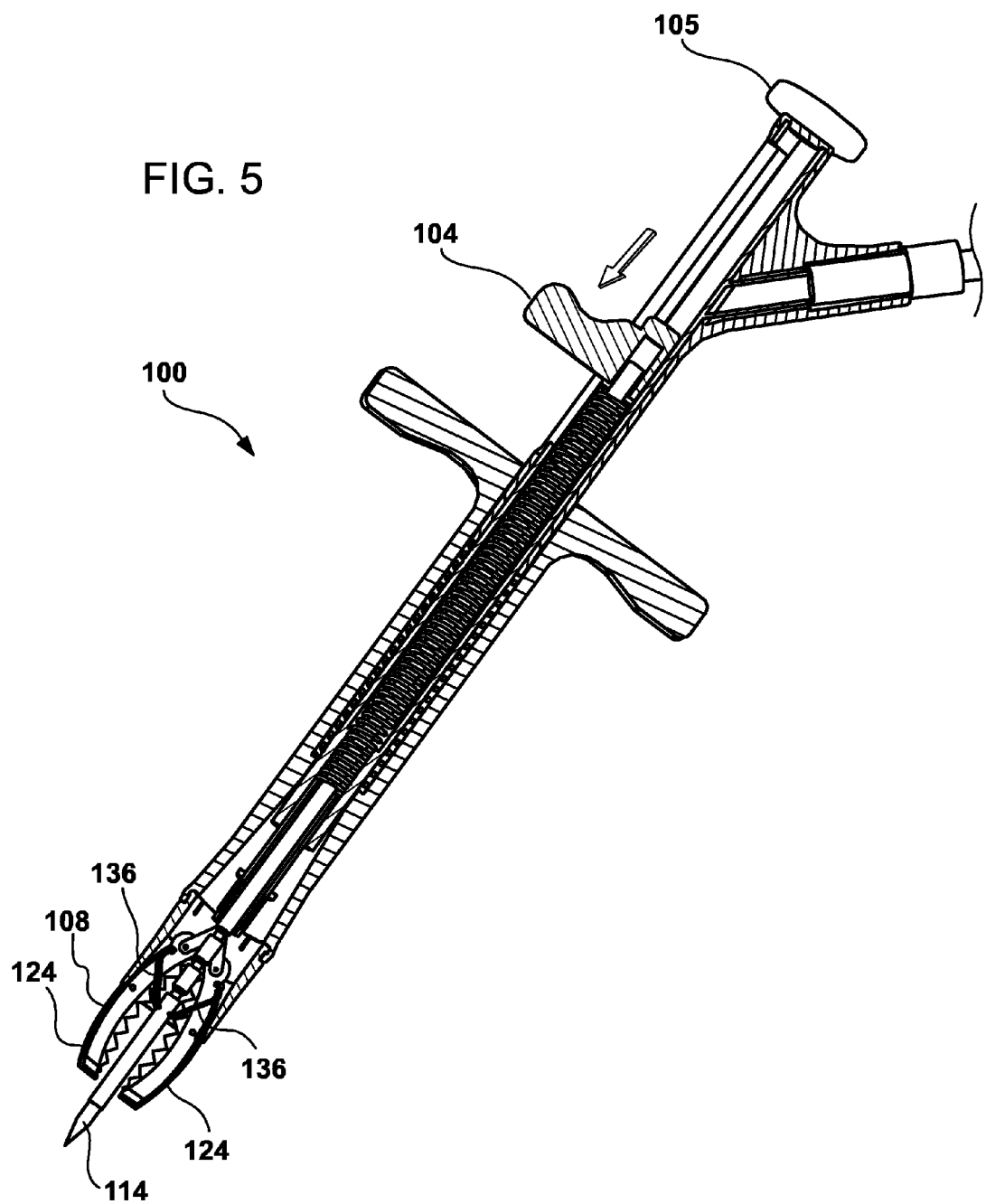
FIG. 5 is a partial cross-section of the probe in an intermediate step with the point starting to be extended, forcing the point catches open and partially opening the jaws of the alligator clamp enabling the point to be extended through the jaws.

FIG. 5 is a partial cross-section of the probe 100 in an intermediate step with the point plunger thumb press 104 starting to be depressed, and starting to extend the point 114 from the housing. The sides of the extending point exert pressure upon the point catches 136 of the alligator clamp assembly and the alligator clamp 108 is partially extended from the open end, with the jaws 124 partially urged open by a torsion spring (not illustrated in this view) only sufficiently as to allow the point 114 to extend through the jaws 124 without making contact with the jaws.

Figure 6:
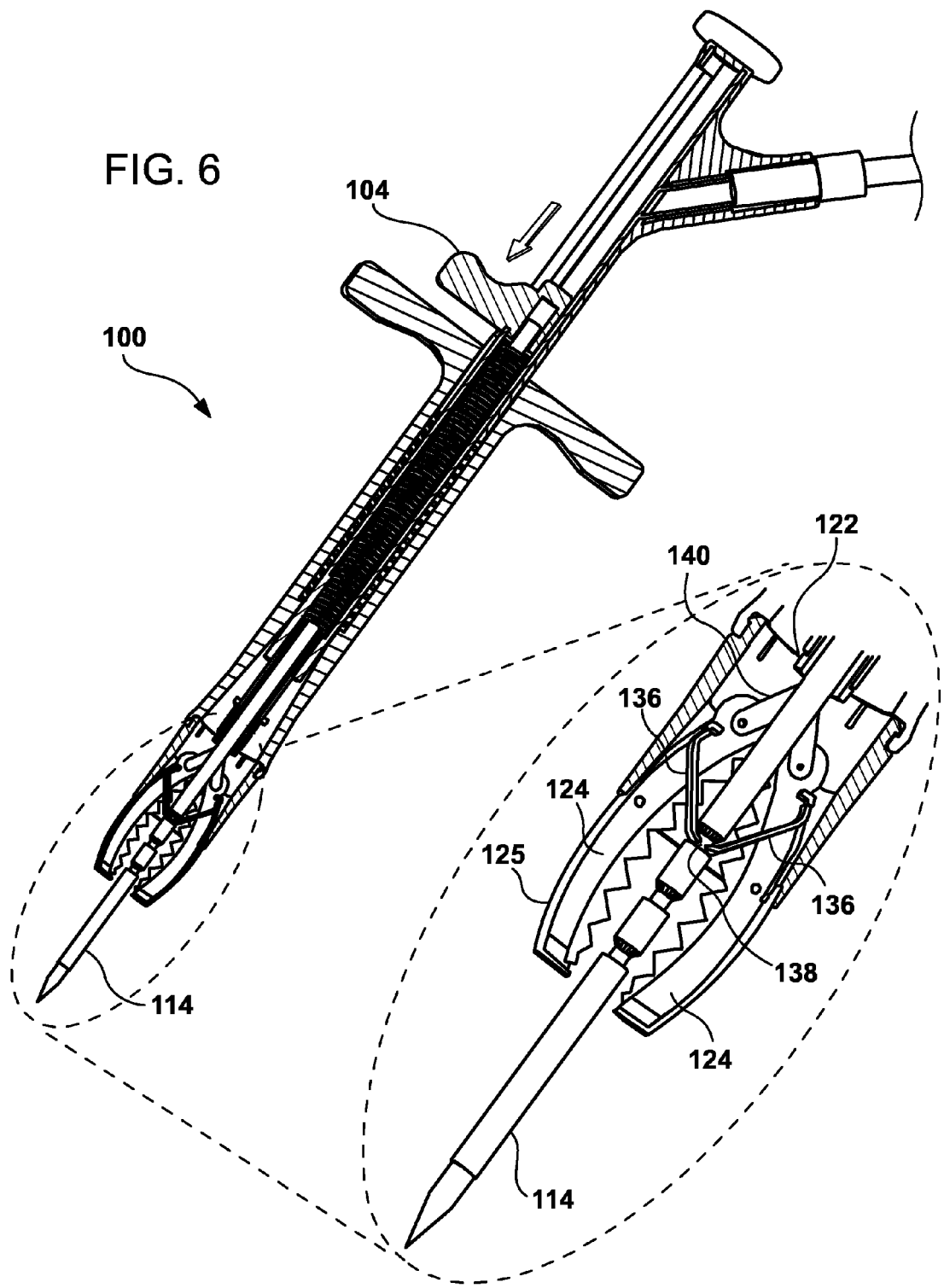
FIG. 6 is a partial cross-section of the probe with the point fully extended, with the point catches engaged in a catch detent on the point, and an enlarged view of the open end area of the probe for clarity.

FIG. 6 is a partial cross-section and enlarged view of the open end portion of the probe 100 with the point 114 now fully extended, and the point catches 136 engaged in a peripheral catch detent 138 on the point 114 to temporarily lock the point in an extended position. Point catches 136 may comprise two planar leaves on the inside of each alligator clamp jaw, and engage the peripheral detent to fix the point in an extended position at a length that is determined by the position of the one or more peripheral detents along the length of the point. This fixes the point 114 in the extended position and holds the point in that position rigidly and without movement due to lateral or direct pressures that may be encountered in operational testing, as a result of the combined interaction of the alligator clamp plunger compression spring and its force on the catch detent and the point plunger compression spring on the point directly. This also forms a one-way ratchet mechanism, preventing the point from slipping backward into the housing under the application of substantial direct or lateral pressure on the point as may be needed when testing corroded terminals or wires. Alternatively, the point could be retained in the extended position by other well known mechanisms, such as by a catch that engages the point thumb press itself.

The jaws 124 of the alligator clamp are preferably connected to the alligator clamp plunger 122 by means of a pivot bar 140 wherein each jaw is independently pivoted on a separate axis on the pivot bar, thus allowing each jaw to be distanced from the other and therefore enabled to open to a wider position than would be possible if both jaws were pivoted on a common pivot point. Jaws 124 also preferably include insulation 125 on any exposed outer surface.

Figure 7:
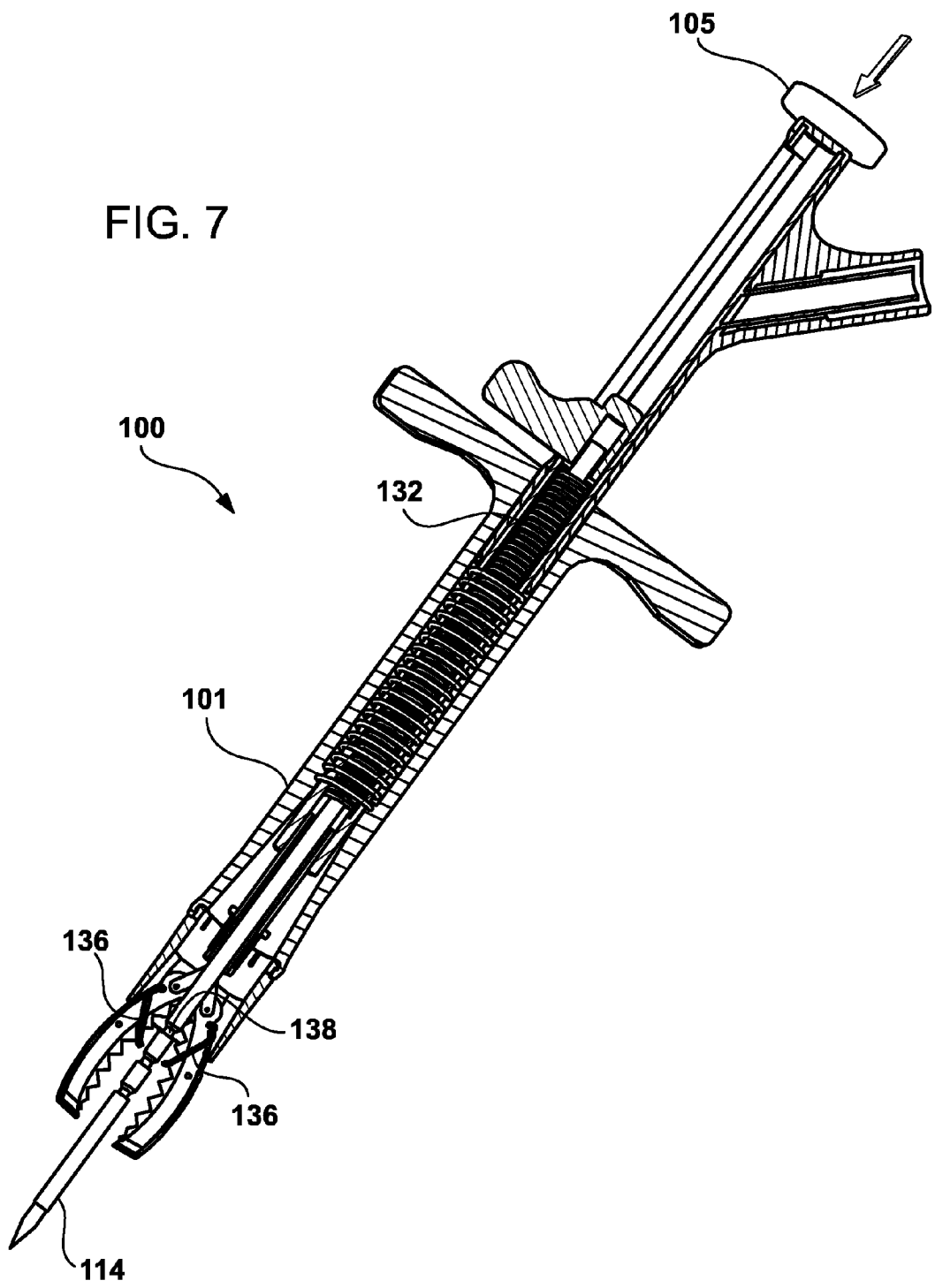
FIG. 7 is a partial cross-section of the probe in an intermediate step with the alligator clamp plunger partially depressed to disengage the point catches from the catch detent on the point, and the point starting to be retracted.

FIG. 7 is a partial cross-section of the probe 100 in an intermediate step with the alligator clamp thumb press 105 partially depressed to disengage the point catches 136 from the catch detent 138 and release the point 114, and the point 114 starting to be retracted into the housing 101 by action of the point compression spring 132.

Figure 8:
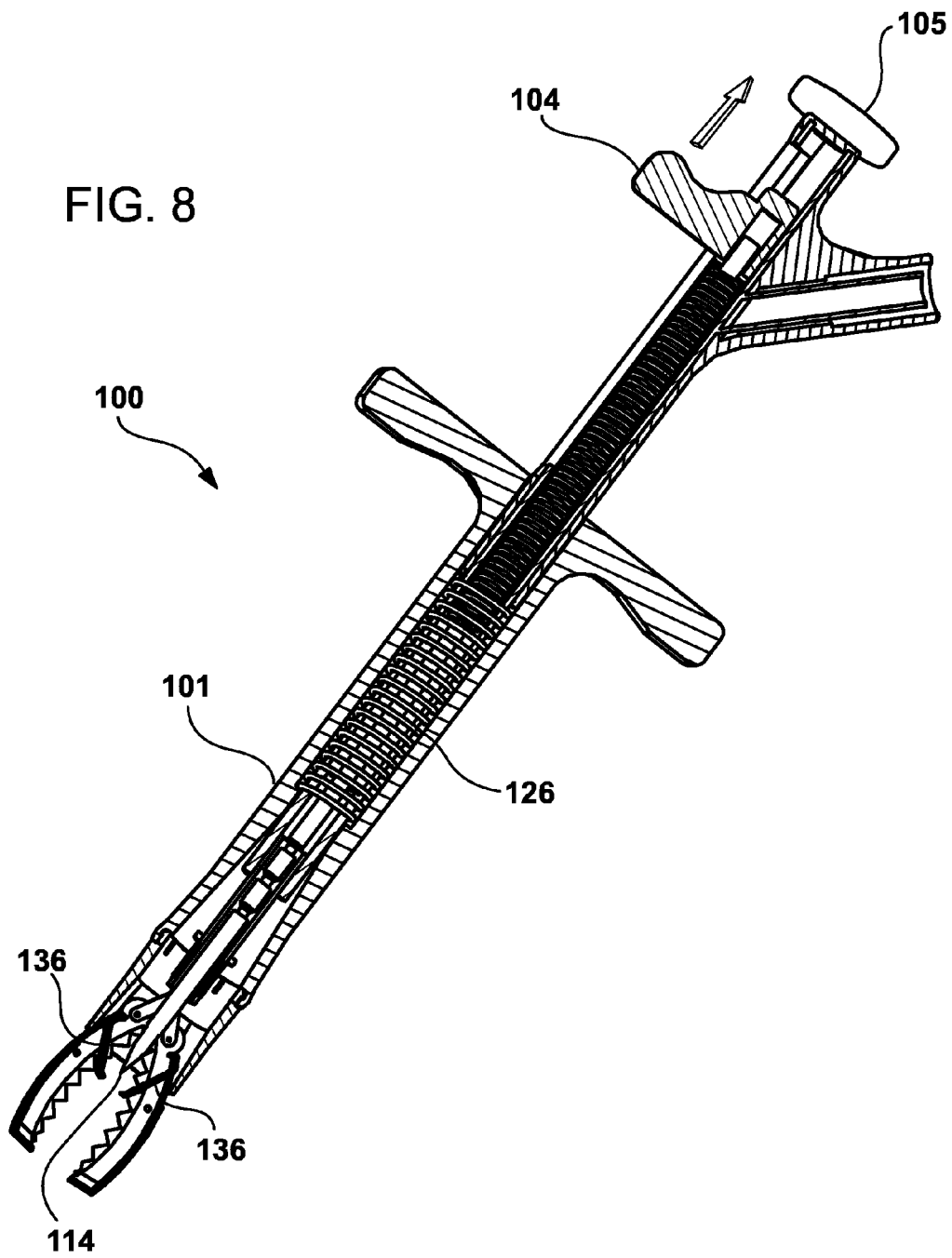
FIG. 8 is a partial cross-section of the probe in an intermediate step with the alligator clamp plunger still partially depressed to keep the point catches open, and the point nearly fully retracted.

FIG. 8 is a partial cross-section of the probe 100 in a further intermediate step with the alligator clip thumb press 105 still partially depressed to keep the point catches 136 open, and the point 114 nearly fully retracted into the housing 101.

Figure 9:
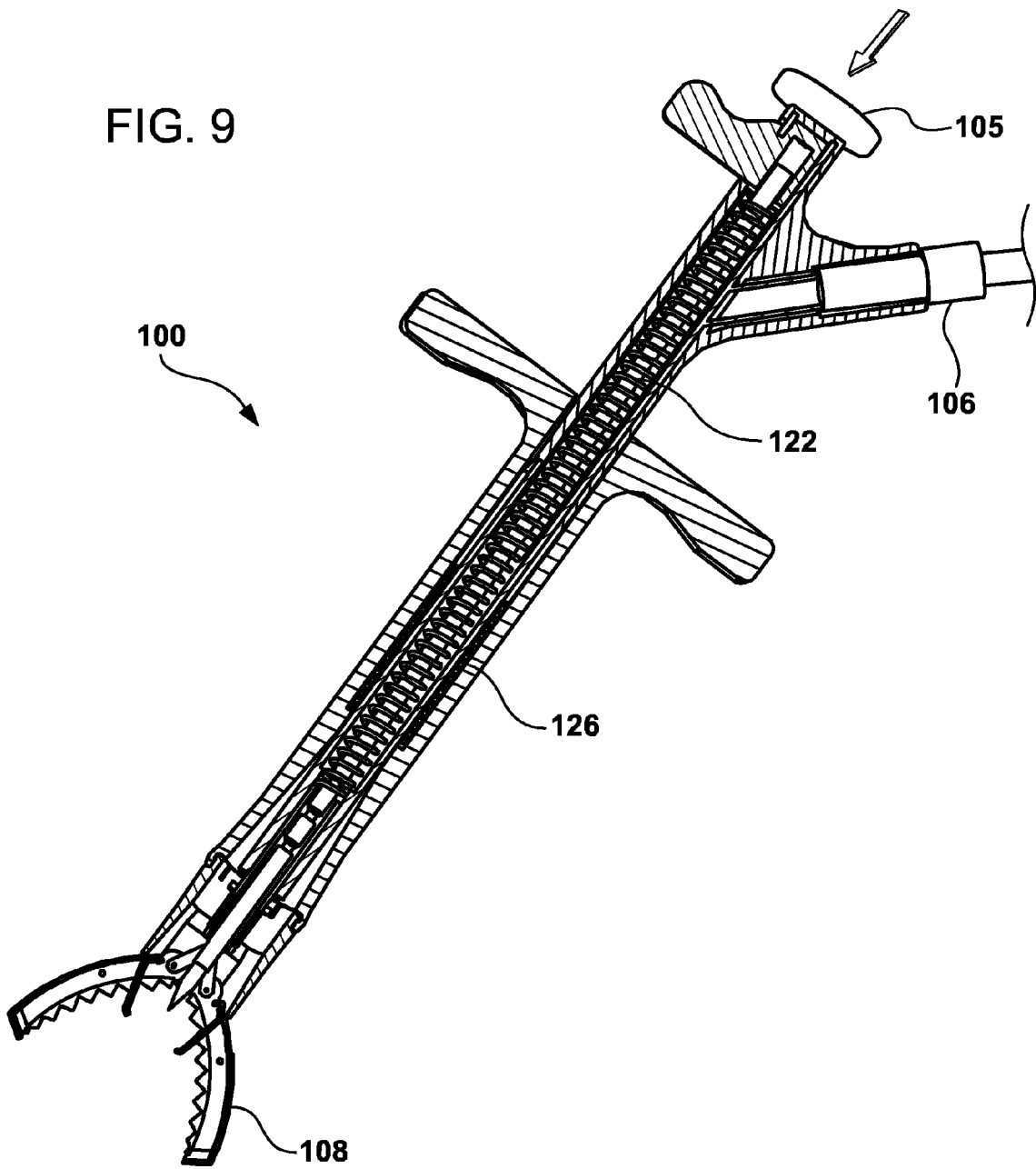
FIG. 9 is a partial cross-section of the probe with the alligator clamp plunger fully depressed and the alligator clamp fully extended and open.

FIG. 9 is a partial cross-section of the probe 100 with the alligator clamp thumb press 105 fully depressed and the alligator clamp 108 fully extended and open. Relaxing of pressure on the alligator clamp thumb press 105 causes the jaws of the clamp to begin to retract into the open end of the housing by action of the alligator clamp compression spring 126, urging the jaws to close and clamp upon a component on the device under test. Return of pressure on the alligator clamp thumb press 105 causes the jaws of the clamp to again extend from the open end of the housing, urging the jaws to open by action of the alligator clamp torsion spring and release the clamping of the component on the device under test.

The alligator clamp plunger 122 of the probe may be configured to include an angled section extending from the plunger which contains the test lead socket 106. The socket 106 may be angled in relation to the alligator clamp plunger so that the socket may be used as a thumb rest to exert the thumb pressure on the alligator clamp plunger to cause the alligator clamp to extend from the housing as described above. The thumb press(es), finger rest, and socket may thus be located in relative positions so that single hand operational testing can be achieved with only the need to use thumb movements to deploy and retract the alligator clamp or point.

FIG. 10 is a partial cross-section of the open end portion of the probe with the alligator clamp 108 fully open, illustrating the alligator clamp swivel 150 connected to alligator clamp plunger 122 to enable selective radial orientation of the jaws 124. Also illustrated is a jaw torsion spring 152 that urges the alligator clamp jaws 124 open when they are extended from the housing, and not closed by contact with open end 110. Also visible in this view are the preferred U-shaped tips 154 of point catches 136, which serves to prevent contact with and damage to the extreme end of the point 114 when the point passes through the point catches during point extension.

Operation of the inventive apparatus may include the steps of: connecting the leads between the probe and the multimeter; adjusting the rotation of the alligator clamp for optimum view of the jaws opening (if required); grasping the probe with fingers and thumb; starting the testing procedure by depressing and releasing the clamp plunger to deploy the alligator clamp onto the device under test; depressing the clamp plunger to remove the clamp from the device under test; depressing the point plunger to deploy the point to a length required; and depressing the clamp plunger to retract the point.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like. For example, the point and alligator clamp have been described herein as coaxial, but they could also be arranged in an adjacent (side-by-side) configuration.

Therefore, the above description and illustrations should not be construed as limiting the scope of the invention, which is defined by the appended claims.

What is claimed as invention is:

1. A multifunction test instrument probe comprising:
a housing having a hollow bore with an open end;
a first plunger carried in said hollow bore, said first plunger having a first end including a thumb press portion, a second end terminating in an alligator clamp having a pair of jaws, and a first plunger compression spring normally biasing said first end thumb press away from said housing, and normally biasing said alligator clamp substantially within said hollow bore proximate said open end;
a second plunger carried in said hollow bore, said second plunger having a first end including a thumb press portion, a second end terminating in a point, and a second plunger compression spring normally biasing said first end thumb press away from said housing, and biasing said point within said hollow bore proximate said open end;
wherein when said first plunger is depressed, said alligator clamp is extended from said open end and said jaws are urged open by a jaw spring, and when said first plunger is released, said first plunger compression spring acts to retract said alligator clamp back towards said hollow bore and said jaws are urged closed by contact with said open end; and when said second plunger is depressed, said point is extended from said open end.

2. The multifunction test instrument probe of claim 1 wherein when said alligator clamp is extended and said jaws are placed over a component on a device under test, said first plunger is released, and said first plunger compression spring retracts said alligator clamp back towards said hollow bore, said jaws are urged together by contact with said open end to clamp onto the component on the device under test.

3. The multifunction test instrument probe of claim 1 wherein said alligator clamp includes a point catch and said second plunger includes at least one peripheral detent, wherein when said second plunger is depressed and said point is extended from said open end, said point catch engages said peripheral detent to fix said point in an extended position.

4. The multifunction test instrument probe of claim 3 wherein said second plunger includes a plurality of peripheral detents, and said point is fixed in an extended position to a length that is determined by the position of one of said peripheral detents.

5. The multifunction test instrument probe of claim 3 wherein when said point is fixed in an extended position and said first plunger is depressed, said point catch is disengaged from said second plunger peripheral detent and said point is retracted into a normal position within said hollow bore by said second plunger compression spring.

6. The multifunction test instrument probe of claim 1 wherein when said second plunger is depressed, said alligator clamp is partially extended from said open end, said jaws are partially urged open by said jaw spring, and said point is extended through said jaws.

7. The multifunction test instrument probe of claim 1 wherein said housing includes at least one finger grip.

8. The multifunction test instrument probe of claim 1 wherein said housing is one of cylindrical, square, rectangular, or multifaceted.

9. The multifunction test instrument probe of claim 1 wherein said hollow bore and said first plunger are coaxial.

10. The multifunction test instrument probe of claim 1 wherein said hollow bore, said first plunger, and said second plunger are coaxial.

11. The multifunction test instrument probe of claim 1 wherein said alligator clamp jaws have an insulated outer surface.

12. The multifunction test instrument probe of claim 1 wherein said jaw spring comprises at least one torsion spring.

13. The multifunction test instrument probe of claim 1 wherein when said second plunger is depressed, said point displaces a catch mechanism on said alligator clamp to partially open said jaws.

14. The multifunction test instrument probe of claim 1 wherein said jaws are independently connected to said first plunger by a pivot bar.

15. The multi-function test instrument probe of claim 1 wherein said second plunger is insulated along all sections where it is exposed when deployed except for a tip of said point which can contact a component under test.

16. The multi-function test instrument probe of claim 1 further including a socket for connection to a test lead.

17. The multi-function test instrument probe of claim 1 wherein said alligator clamp is connected to said first plunger by a swivel to enable variable radial orientation of said jaws.

* * * * *